United States Patent [19]

Cogan

[11] Patent Number: 4,860,081
[45] Date of Patent: Aug. 22, 1989

[54] SEMICONDUCTOR INTEGRATED CIRCUIT STRUCTURE WITH INSULATIVE PARTITIONS

[75] Inventor: Adrian I. Cogan, Waltham, Mass.
[73] Assignee: GTE Laboratories Incorporated, Waltham, Mass.
[21] Appl. No.: 777,484
[22] Filed: Sep. 19, 1985

Related U.S. Application Data

[62] Division of Ser. No. 625,390, Jun. 28, 1984.
[51] Int. Cl.[4] ............................................. H01L 27/12
[52] U.S. Cl. ........................................ 357/49; 357/59; 357/54; 357/60
[58] Field of Search ............... 357/59, 60, 49, 54, 357/45, 47, 59 H, 59 R, 59 F

[56] References Cited
U.S. PATENT DOCUMENTS

| | | | |
|---|---|---|---|
| 3,456,335 | 7/1969 | Hennings et al. | 357/59 F X |
| 3,461,003 | 8/1969 | Jackson, Jr. | 148/175 |
| 3,689,992 | 9/1972 | Schutze et al. | 357/59 R X |
| 3,850,707 | 11/1974 | Bestland | 148/175 |
| 3,871,007 | 3/1975 | Wakamiya et al. | 357/59 R X |
| 3,884,733 | 5/1975 | Bean | 148/175 |
| 3,905,037 | 9/1975 | Bean et al. | 357/60 |
| 4,104,086 | 8/1978 | Bondur et al. | 148/1.5 |
| 4,255,209 | 3/1981 | Morcom et al. | 148/175 |
| 4,283,235 | 8/1981 | Raffel et al. | 357/59 R X |
| 4,393,573 | 7/1983 | Rato et al. | 29/571 |
| 4,393,574 | 7/1983 | Shimbo | 29/571 |
| 4,481,707 | 11/1984 | Cunniff | 357/49 X |
| 4,507,158 | 3/1985 | Kamins et al. | 148/175 |

Primary Examiner—Rolf Hille
Assistant Examiner—William A. Mintel
Attorney, Agent, or Firm—James J. Cannon, Jr.; David M. Keay

[57] ABSTRACT

Grooves are formed in a single crystal silicon wafer in a pattern to encircle surface areas. Silicon dioxide is placed in the grooves and on the surface and then removed from certain of the areas. Layers of silicon are epitaxially grown only on these areas and their surfaces are oxidized. Polycrystalline silicon is deposited to a thickness greater than that of the epitaxial layers. Both sides of the wafer are ground and polished to produce flat, planar, opposite surfaces; one surface exposing surface areas of the epitaxial layers, the other surface exposing the silicon dioxide in the grooves. The resulting substrate has two types of silicon sections, each of which is electrically isolated from the other by silicon dioxide partitions. One type of section is of silicon of the original wafer, has a surface area in only one surface, and is suitable for the fabrication of low voltage, low power devices therein. The other type of section has two zones, one of silicon of the original wafer at one surface and the other of epitaxial silicon at the other surface. This type of section is suitable for the fabrication of high voltage, high power devices therein.

3 Claims, 4 Drawing Sheets

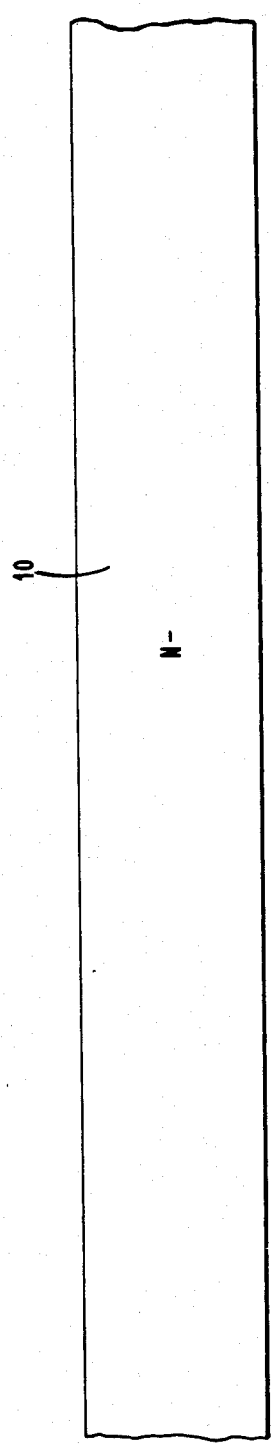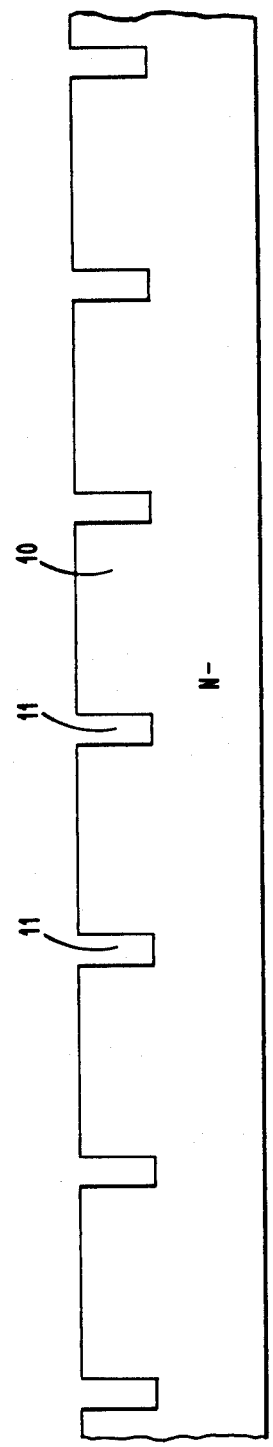
Fig. 1.
Fig. 2.

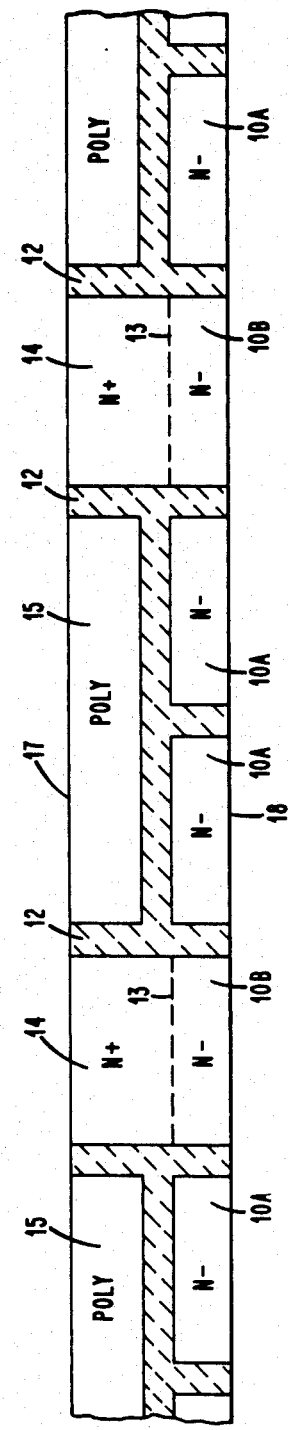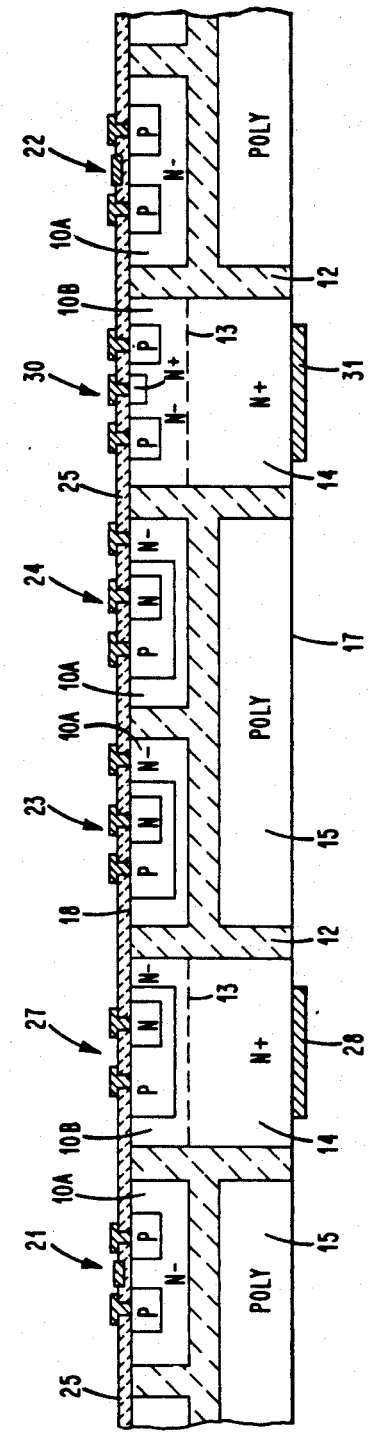

SEMICONDUCTOR INTEGRATED CIRCUIT STRUCTURE WITH INSULATIVE PARTITIONS

This is a divisional of co-pending application ser. No. 625,390 filed on June 28, 1984, now U.S. Pat. No. 4,570,330, issued Feb. 18, 1986.

BACKGROUND OF THE INVENTION

This invention relates to semiconductor integrated circuit structures. More particularly, it is concerned with substrates for the fabrication of semiconductor integrated circuit devices therein and with methods of producing such substrates.

Monolithic semiconductor integrated circuit structures, or chips, which employ bipolar and MOS type devices are well-known and widely used. Typically the devices are of low voltage and low power. Electrical connections to the devices are at the upper surface of the chip or in the semiconductor material adjacent to the upper surface.

For many applications it is desirable to employ relatively high voltage, high power devices and low voltage, low power devices within the same chip. Typically, high voltage, high power devices are of vertical configuration; that is, current flow in the device is vertical between the upper surface and the lower surface of the chip rather than lateral. Although the processing steps employed in the fabrication of these devices may be compatible with those employed in the fabrication of low voltage, low power MOS and bipolar devices, techniques typically employed to provide electrical isolation between the individual devices in a chip do not permit more than one device of vertical structure within a chip.

SUMMARY OF THE INVENTION

The method in accordance with the present invention provides for producing an improved substrate to permit the fabrication of any number of both low power lateral current flow and high power vertical current flow devices within the same substrate. The method comprises providing a body of semiconductor material of one conductivit type of relatively high resistivity having opposite first and second surfaces. Grooves are formed in the body at the first surface to provide a plurality of isolated areas of the first surface. Each area is encircled by grooves. a first coating of an adherent nonconductive protective material is formed overlying the first surface and filling the grooves. Protective material of the coating is removed to expose particular regions of the first surface, each of the regions encompassing only one of the plurality of isloated areas of the first surface. Epitaxial layers of semiconductor material of the one conductivity type of relatively low resistivity are grown on each of the regions of the first surface. Each of the epitaxial layers has side surfaces encircling the layer and disposed transversely of the first surface of the body. A second coating of the adherent nonconductive protective material is formed on the exposed surfaces of the epitaxial layers to provide with the remainder of the first coating a continuous coating of the adherent nonconductive material. Then a layer of semiconductor material is deposited on the coating of adherent nonconductive protective material. The deposited layer of semiconductor material is adherent to the remainder of the first coating of protective material and to the portions of the second coating adherent to the side surfaces of the epitaxial layers. Material is then removed to provide a first planar surface including surfaces of the deposited layer of semiconductor material and surfaces of the epitaxial layers of semiconductor material which are encircled by surfaces of protective material. Material is also removed to provide a second planar surface substantially parallel to the first planar surface. The second planar surface includes a plurality of surface areas of semiconductor material of the one conductivity type of relatively high resistivity encircled by surfaces of protective material in the grooves. The resulting substrate includes first and second sections of semiconductor material; each section being electrically isolated from the other sections by intervening nonconductive protective material. Each of the frist sections is of semiconductor material of the one conductivity type of relatively high resistivity, has a surface area in the second planar surface, and extends to a portion of the one coating of nonconductive protective material lying between the semiconductor material of the one conductivity type of relatively high resistivity and semiconductor material of the deposited layer. Each of the second sections includes a first zone of semiconductor material of the one conductivity type of relatively high resistivity having a surface area in the second planar surface and a second zone of semiconductor material of the one conductivity type of relatively low resistivity contiguous to the first zone and having a surface area in the first planar surface.

In accordance with another aspect of the present invention a substrate for the fabrication of semiconductor integrated circuit devices therein comprises a plurality of first sections of semiconductor material of one conductivity type of relatively high resistivity. Each first section has a surface area in a first surface of the substrate and is surrounded by partitions of adherent nonconductive protective material except at the first surface, whereby each of the first sections is electrically isolated from each of the other first sections. The substrate also includes a plurality of second sections of semiconductor material of the one conductivity type. Each of the second sections is encircled by partitions of adherent nonconductive protective material, whereby each of the second sections is electrically isolated from each of the other second sections and from each of the first sections. Each of the second sections includes a first zone of semiconductor material of the one conductivity type of relatively high resistivity having a surface area in the first surface and a second zone of semiconductor materialof the one conductivity type of relatively low resistivity contiguous the first zone and having a surface area in a second surface of the substrate.

BRIEF DESCRIPTION OF THE DRAWINGS

In the drawings:

FIGS. 1 through 7 are a series of elevational views in cross-section of a fragment of a wafer of semiconductor material illustrating successive steps in the fabrication of a substrate in accordance with the present invention; and FIG. 8 is an elevational view in cross-sectin illustratng a substrate in accordance with the present invention with illustrative devices fabricated therein.

In the figures the various elements are not drawn to scale. Certain dimensions are exaggerated in relation to other dimensions in order to present a clearer understanding of the invention.

For a better understanding of the present invention, together with other and further objects, advantages, and capabilities thereof, reference is made to the following discussion and appended claims in connection with the above-described drawings.

DETAILED DESCRIPTION OF THE INVENTION

In fabricating a substrate in accordance with the present invention as illustrated in the figures a wafer or body of single crystal semiconductor material of one conductivity type is provided as a starting material. As is well-understood the wafer is usually a slice of relatively large surface area upon which many identical integrated circuits may be fabricated simultaneously. However, for purposes of illustration only a portion of a substrate employing a fragment of a slice as a starting material will be shown and described. In the following description silicon is employed as the semiconductor material and the starting material is of relatively high resistivity N-type conductivity.

A wafer of N-type single crystal silicon of uniform relatively high resistivity having a flat, planar, parallel opposite major surfaces, a fragment 10 of which is shown in FIG. 1, is produced by any of the know techniques of crystal fabrication including appropriate slicing and cleaning operations. By employing known techniques of masking and etching silicon is selectively removed from the upper surface in a pattern of grooves or trenches 11 (FIG. 2). The grooves preferably may be formed by anistropic reactive ion etching techniques. The pattern of grooves 11 in the upper surface produces isolated areas of the upper surface, each of which is completely encircled by grooves.

Figure 3:
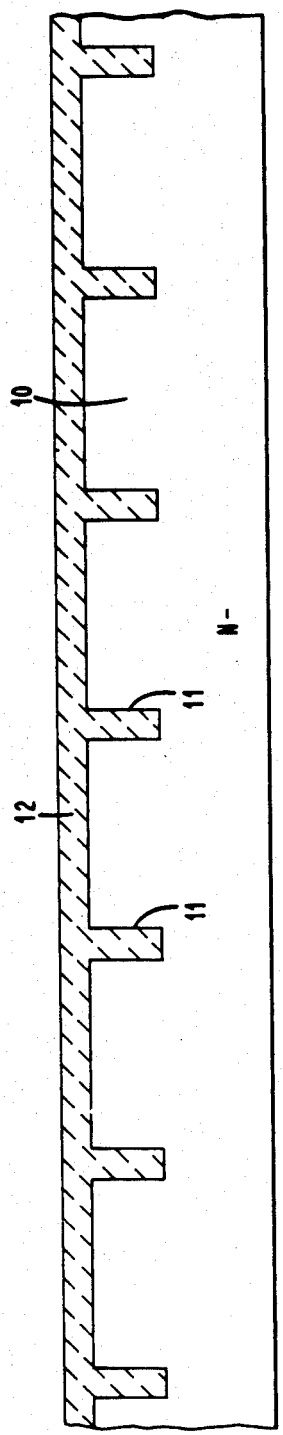

The wafer is then treated in the presence of oxygen at an elevated temperature to cause the exposed silicon at the upper surface and at the surfaces of the grooves 11 to be converted to silicon dixoide. Additional silicon dioxide is deposited by employing known chemical vapor deposition techniques to produce an adherent nonconductive protective layer 12 overlying the upper surface of the wafer 10 and filling the grooves 11 as shown in FIG. 3. Suitable reactive ion etching or other dry etching techniques are employed to produce a smooth, planar, upper surface.

Figure 4:
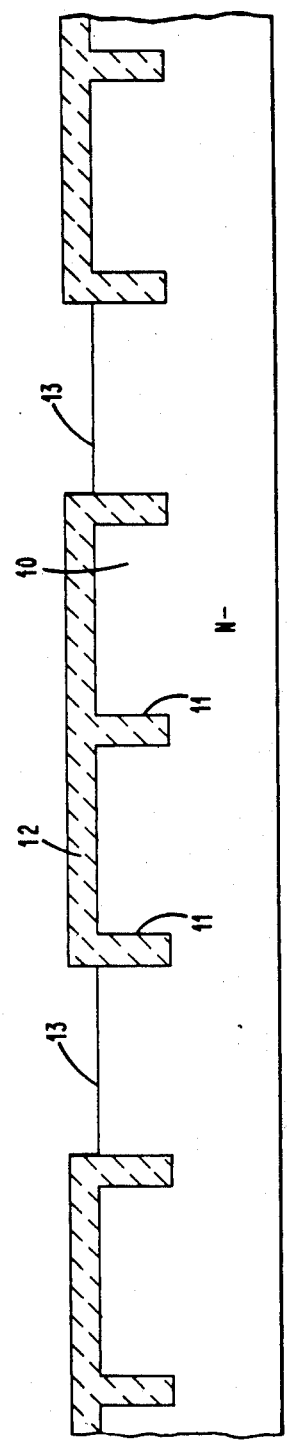
Figure 5:
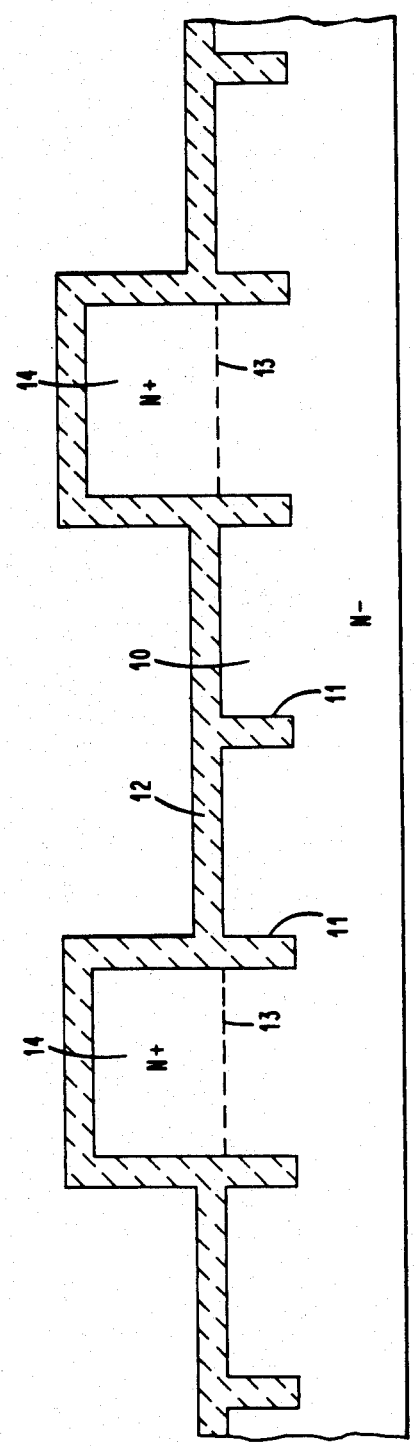

Next, by employing standard photoresist masking and etching techniques portions of the silicon dioxide layer 12 are removed to expose the silicon surfaces 13 in certain of the areas encircled by the grooves 11. The wafer at this stage is illustrated in FIG. 4. silicon is then deposited on the exposed areas 13 by known vapor deposition techniques to produce an epitaxial layer 14 at each of the areas 13 as shown in FIG. 5. As is well known the epitaxial layers 14 are continuations of the crystalline structure of the single crystal wafer 10. The resistivity of the layers is controlled during deposition to provide relatively low resistivity N-type silicon.

Depending upon the crystal orientation of the silicon body 10, the side surfaces of the layers 14 transverse to the surface of the wafer may taper inwardly or outwardly or be disposed normal to the surface. For convenience in illustrating, the layers of epitaxial material illustrated in FIG. 5 are shown having side surfaces disposed generally normal to the surface of the wafer. Depending upon the techniques employed, it may be desirable to treat the wafer to remove silicon deposits from the surfaces of the silicon dioxide layer 12. The wafer is treated in the presence of oxygen at an elevated temperature to cause the exposed silicon of the side and upper surfaces of the layers 14 to be converted to silicon dioxide. A continuous adherent nonconductive protective coating 12 of silicon dioxide is thus provided on the silicon surfaces of the upper portion of the wafer.

Figure 6:
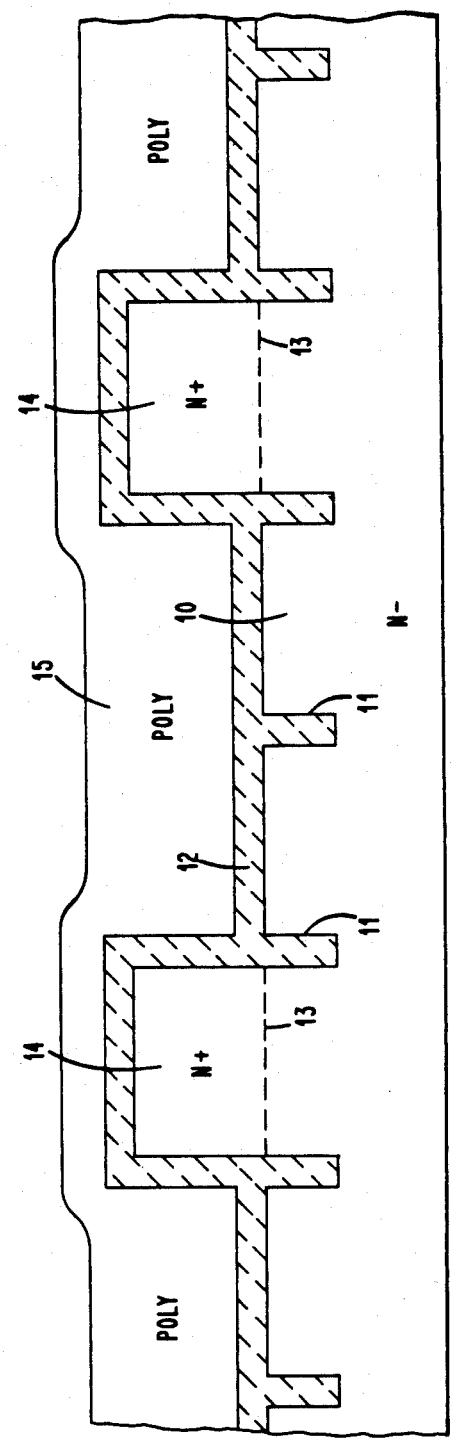

Next, a thick, adherent layer of polycrystalline silicon 15 is deposited on the silicon dioxide 12 overlying the upper surface of the wafer as illustrated in FIG. 6. The thickness of the polycrystalline silicon layer 15 is greater than that of the epitaxially deposited silicon layers 14. The wafer in then treated as by grinding and polishing in order to remove material from the upper portions as illustrated in FIG. 7. Sufficient material is removed to produce a planar upper surface 17 including exposed surfaces of the epitaxial layers 14. The lower surface is also ground and polished to remove material to a depth sufficient to expose the silicon dioxide 12 in the grooves 11 at a lower planar surface 18 which is substantially parallel to the upper surface 17.

As illustrated in FIG. 7 the resulting structure is a substrate containing a plurality of N-type silicon sections 10A of relatively high resistivity which are completely surrounded except at one of the surface 18 by partitions of silocon dioxide 12. The silicon dioxide partitions 12 electrically isolate the sections 10A from each other and from other portions of the substrate. The substrate also includes a plurality of second sections consisting of two zones. One zone 10B is of relatively high resistivity N-type epitaxially grown silicon and has a surface 18. The other zone 14 is of relatively low resistivity N-type epitaxially grown silicon and has a surface area in the other surface 17 of the substrate. The two zones 10B and 14 are contiguous at an interface 13. Each of the second sections 10B-14 is encircled by partitions of silicon dioxide 12 which electrically isolate each section from other portions of the substrate. Segments of polycrystalline silicon 15 fill the spaces between the insulating partitions 12 and the surface 17 which are not occupied by sections of single crystal silicon. These segments thus provide supporting structure and are inactive electrically.

FIG. 8 illustrates the substrate of FIG. 7 with illustrative semiconductor devices fabricated therein. In accordance with the usual convention the substrate is illustrated in FIG. 8 with its upper and lower surfaces reversed from the showings in FIGS. 1–7. As illustrated in FIG. 8 each of the first sections 10A contains a low voltage, low power device having all its electrical connections at one surface 18 which is protected by a silicon dioxide layer 25. Devices illustrated include N-channel MOS field effect transistors 21 and 22 and bipolar NPN transistors 23 and 24.

One of the second sections of two zones 10B and 14 contains an NPN bipolar power transistor 27. In this device the base and emitter contacts are at one surface 18 and the collector contact 28 is at the opposite surface 17. As is well-known this vertical configuration permits high power operation of the device.

Another type of high voltage, high power device which can be fabricated in an individual second section 10B-14 is a junction field effect transistor 30. In this device current flows from an N+source at one surface 18 to a drain contact 31 at the opposite surface 17. Voltage at the P-type gate regions controls the flow of current between the source and drain. For illustrative purposes only a single N+ source and two P-type gate regions are shown, although an actual device includes a large number of these elements arranged in a parallel structure.

Thus, a substrate as illustrated permits the fabrication of any number of relatively high power type devices having vertical current flow in an integrated circuit structure together with low voltage, low power devices.

In producing an exemplary substrate in accordance with the invention, the starting wafer 10 may be a slice of single crystal N-type silicon doped with arsenic to produce a uniform resistivity of about 25 ohm-centimeters. The wafer is approximately 250 micrometers thick. The grooves 11 may be about 30 micrometers deep and 5 to 10 mircometers wide. The epitaxially grown layers are about 100 micrometers thick. The silicon in the layers is doped with arsenic during deposition to provide a uniform resistivity of the order of 0.1 ohm-centimeters. The silicon dioxide insulating partitions 12, other than those formed by the filled in grooves, are 1 micrometer thick. The final thickness of the substrate after grinding and polishing from both sides is about 100 micrometers.

While there as been shown and described what is considered a preferred embodiment of the present invention, it will be obvious to those skilled in the art that various changes and modifications may be made therein without departing from the invention as defined by the appended claims.

What is claimed is:

1. A substrate for the fabrication of semiconductor integrated circuit devices therein comprising
    a plurality of first sections of single crystal semiconductor material of one conductivity type of relatively high resistivity, each first section having a surface area in a first surface of the substrate and being surrounded by partitions of adherent nonconductive protective material except at said first surface whereby each of said first sections is electrically isolated from each of the other first sections;
    a plurality of second sections of single crystal semiconductor material of the one conductivity type, each second section being encircled by partitions of adherent nonconductive protective material whereby each of said second sections is electrically isolated from each of the other second sections and from each of the first sections;
    each of said second sections including a first zone of single crystal semiconductor material of the one conductivity type of relatively high resistivity having a surface area in said first surface and a second zone of single crystal semiconductor material of the one conductivity type of relatively low resistivity contiguous to said first zone and having a surface area in a second surface of the substrate;
    said first and second surfaces being flat, planar, parallel, opposite surfaces of the substrate;
    the pattern of said partitions in said first surface forming a continuous pattern of contiguous, interconnected partitions encircling each of the plurality of first and each of the plurality of second sections; and
    a plurality of segments of polycrystalline semiconductor material each having a surface area in said second surface and disposed between said first sections and said second surface;
    each sgement of polycrystalline semiconductor material being surrounded by partitions of adherent nonconductive protective material except at said surface area thereof in said second surface and being electrically isolated from each of the first and second sections.

2. A substrate in accordance with claim 1 wherein
    said single crystal semiconductor material is single crystal silicon; and
    said nonconductive protective material is silicon dioxide.

3. A substrate in accordance with claim 2 wherein
    said first zone and said second zone of each of said second sections are contiguous at an interface between the first and second zones; and
    the interface between the first and second zone of each of the second sections lies substantially in a plane parallel to said first and second surfaces.

* * * * *